United States Patent
Chiou et al.

(10) Patent No.: US 6,221,754 B1
(45) Date of Patent: Apr. 24, 2001

(54) METHOD OF FABRICATING A PLUG

(75) Inventors: J. C. Chiou, Hsinchu; Hsiao-Pang Chou, Hsinten, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/181,092

(22) Filed: Oct. 28, 1998

(30) Foreign Application Priority Data

Aug. 21, 1998 (TW) .................................................. 87113800

(51) Int. Cl.⁷ ................................................ H01L 21/4763
(52) U.S. Cl. ........................... 438/619; 438/421; 438/422; 438/625; 438/629; 438/626; 438/642; 438/644; 438/645; 438/648; 438/652; 438/654; 438/656; 438/672; 438/685; 438/688; 438/680
(58) Field of Search ..................................... 438/619, 625, 438/626, 629, 642, 644, 645, 648, 652, 654, 656, 672, 685, 688, 680, 421, 422

(56) References Cited

U.S. PATENT DOCUMENTS

| | | | |
|---|---|---|---|
| 5,260,232 | * 11/1993 | Muroyama et al. | 437/187 |
| 5,747,379 | * 5/1998 | Huang et al. | 438/586 |
| 5,970,377 | * 10/1999 | Park | 438/643 |
| 5,976,975 | * 11/1999 | Joshi et al. | 438/672 |

* cited by examiner

Primary Examiner—John F. Niebling
Assistant Examiner—David A Zarneke

(57) ABSTRACT

A method of fabricating a plug etches back the first plug material layer to form a dished surface on the first plug material layer and then performs a second coverage step. A second plug material layer is formed to fill the dished surface and a hole. Thus, the slurry cannot fill the hole during chemical mechanical polishing nor can slurry react with the plug material or the first metallic layer. The reliability of the plug according to the present invention is increased. The thickness of the second plug material layer is thinner than the plug material layer of the conventional method. The thickness is decreased by about 60% when compared with the conventional method, which decreases fabrication costs.

15 Claims, 3 Drawing Sheets

METHOD OF FABRICATING A PLUG

BACKGROUND OF THE INVENTION

1. Field of Invention

The present invention relates to a semiconductor fabricating method. More particularly, the present invention relates to a method of forming interconnects.

2. Description of Related Art

Tungsten plugs are widely used for interconnections of Very Large Scale Integration (VLSI). Because of the poor step coverage ability of tungsten, holes are often formed in the tungsten plug while forming a tungsten plug. Therefore, in the step of performing chemical mechanical polishing (CMP) method, slurry often fills the holes in the plug. The slurry easily reacts with tungsten, and thus the reliability of tungsten plug is reduced.

FIGS. 1A through 1C are cross-sectional views of a portion of a semiconductor device showing steps in a conventional process for forming a plug.

In FIG. 1A, a substrate 100 is provided. A metallic layer 104 is formed on the substrate 100. The metallic layer 104 is used to electrically couple with the other regions. A dielectric layer 102 is formed on the substrate 100. The dielectric layer 102 is etched by conventional microphotography and etching processes. An opening 106 is formed in the dielectric layer 102. The opening 106 exposes the metallic layer 104.

In FIG. 1B, a tungsten layer 122 is formed on the substrate 100. The surface of the tungsten layer 122 is about 5000 Å higher than the surface of the dielectric layer 102. In other words, the thickness 124 of the tungsten layer 122 is about 5000 Å. The tungsten layer 122 is sufficient to fill the opening 106. Because of the poor step coverage ability of the tungsten, a hole 108 is formed in the tungsten plug.

In FIG. 1C, a portion of the tungsten layer 122 on the surface of the dielectric layer 102 is removed by using chemical mechanical polishing. A tungsten plug 122a is formed. An over-polishing method is performed to prevent any portion of the tungsten layer 122 from remaining on the dielectric layer 102. A dished surface 152 is formed on the surface of the tungsten plug 122a. If the hole 108 is large enough, it is easy for the hole 108 to connect with the dished surface 152 to form a hole opening 130. The hole opening 130 exposes the hole 108. At the same time, slurry 132 easily fills the hole 108 through the hole opening 130. The slurry 132, which fills the hole 108, may react with the tungsten plug 122a. Hence, the hole 108 is enlarged. The quality and reliability of the tungsten plug 122a thus are reduced. Furthermore, the cost of the chemical mechanical polishing method is expensive. Using chemical mechanical polishing to remove a tungsten layer of about 5000 Å in thickness costs a lot.

SUMMARY OF THE INVENTION

Accordingly, the present invention provides a method of fabricating a plug comprising the steps of etching back the first plug material layer to form a dished surface on the first plug material layer at a depth of about 1000 Å. A second coverage step is performed. A second plug material layer is formed to fill the dished surface and a hole. Thus, the slurry cannot fill the hole while a chemical mechanical polishing is performed. The slurry cannot react with the plug material or the first metallic layer. The reliability of the plug according to the present invention is increased. The thickness of the second plug material layer is thinner than the plug material layer of the conventional method. The thickness is decreased by about 60% when compared with the conventional method. The fabricating cost is decreased.

To achieve these and other advantages and in accordance with the purpose of the invention, as embodied and broadly described herein, the invention provides the steps of providing a substrate. A dielectric layer is formed on the substrate. The dielectric layer has an opening therein. The dielectric layer exposes a region, which is used to electrically couple with the other regions. A first coverage step is performed to form a first plug material layer on the substrate. The first plug material layer is sufficient to fill the opening. The first plug material layer and a portion of the first plug material on the dielectric layer is removed to form a dished surface on the surface of the opening. A second coverage is performed to form a second plug material layer on the substrate. The second plug material layer is sufficient to fill the dished surface. A chemical mechanical polishing method is performed to removed the second plug material layer on the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
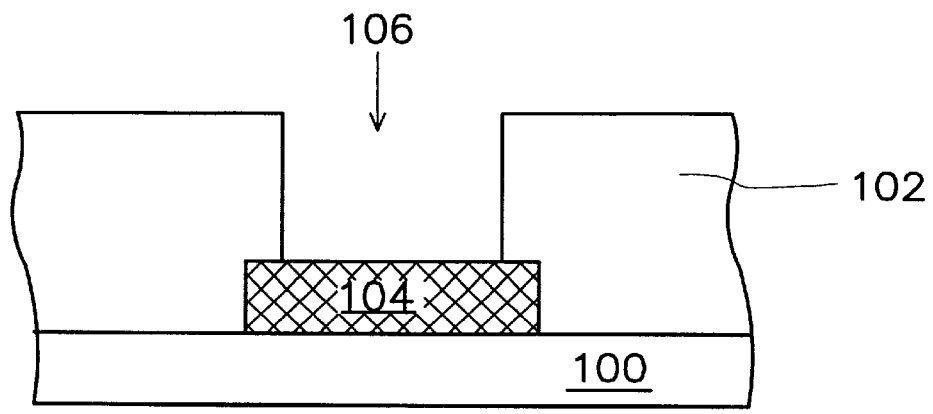
FIGS. 1A through 1C are cross-sectional views of a portion of a semiconductor device showing steps in a conventional process for forming a tungsten plug.
Figure 1B:
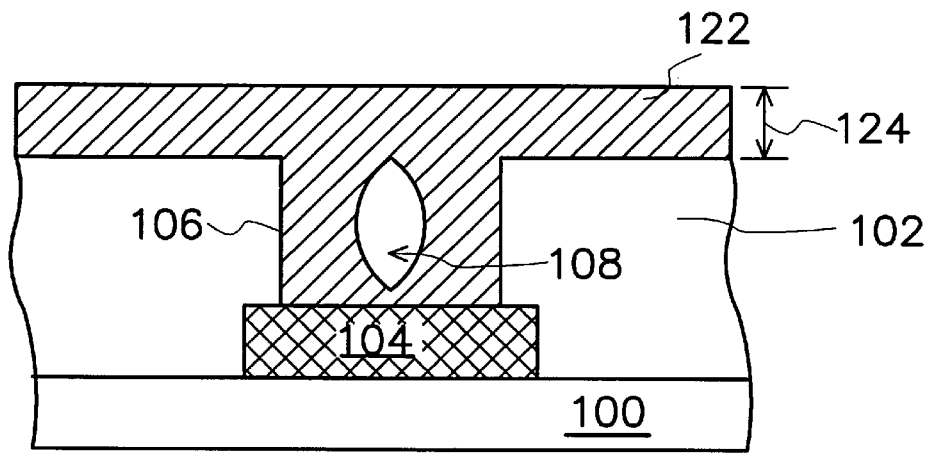
Figure 1C:
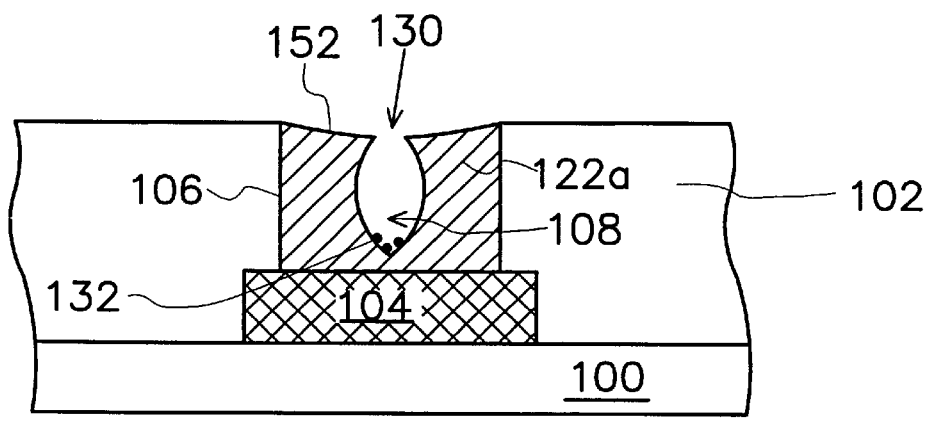

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views of a portion of a semiconductor device showing steps in a process for fabricating a plug according to one preferred embodiment of the invention.

Figure 2A:
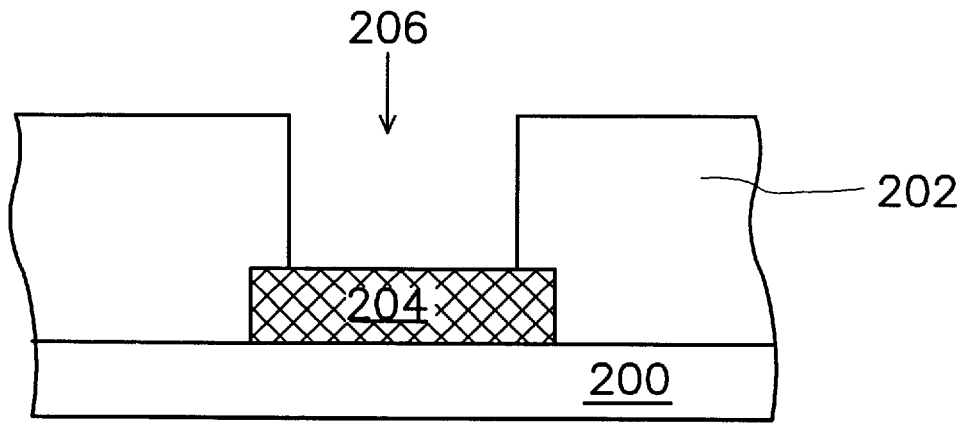
FIGS. 2A through 2F are cross-sectional views of a portion of a semiconductor device showing steps in a process for fabricating a plug according to one preferred embodiment of the invention.

In FIG. 2A, a substrate 200 is provided. A metallic layer 204 is formed on the substrate 200. The metallic layer 204 is used to electrically couple with the other regions. The material of the metallic layer can be aluminum alloy, for example. A dielectric layer 202, such as a silicon oxide layer, is formed on the substrate 200 and over the metallic layer 204. The method of forming a dielectric layer 202 can be a chemical vapor deposition method, for example. The dielectric layer 202 is etched by conventional microphotography and etching processes to form an opening 206. The opening 206 exposes the metallic layer 204. The present invention is not limited to only exposing the metallic layer 204. The opening 206 can expose the source/drain region (not shown) in the substrate 200, for example. The source/drain region is electrically coupled with the other regions.

Figure 2B:
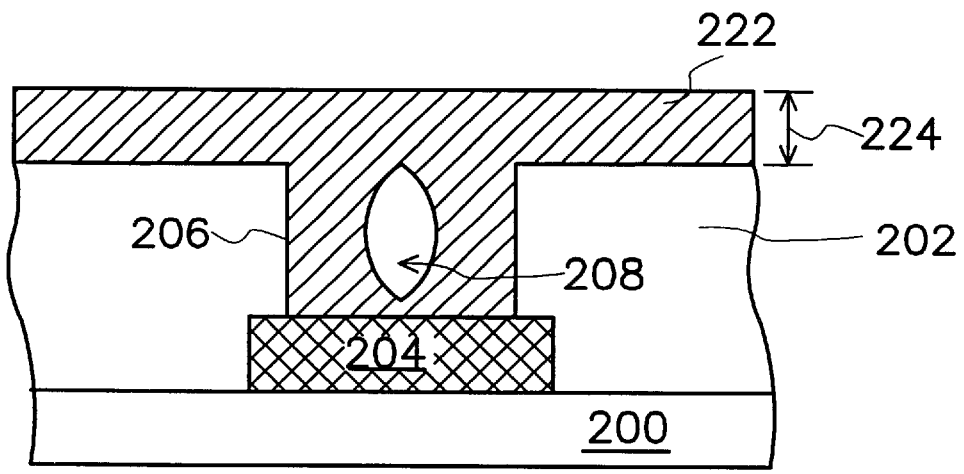

In FIG. 2B, a first coverage step is performed. A first plug material layer 222 is formed over the substrate 200. The first plug material layer 222 can be a tungsten layer, for example. For example, the method of forming the first plug material layer 222 is to deposit a high temperature aluminum by physical vapor deposition. The surface of the first plug material layer 222 is about 5000 Å higher than the surface of the dielectric layer 202. In other words, the thickness 224 of the first plug material layer 222 is about 5000 Å. The first plug material layer 222 is sufficient to fill the opening 206. Because of the poor step coverage ability of the tungsten, a hole 208 is formed in the plug material in the opening 206.

Figure 2C:
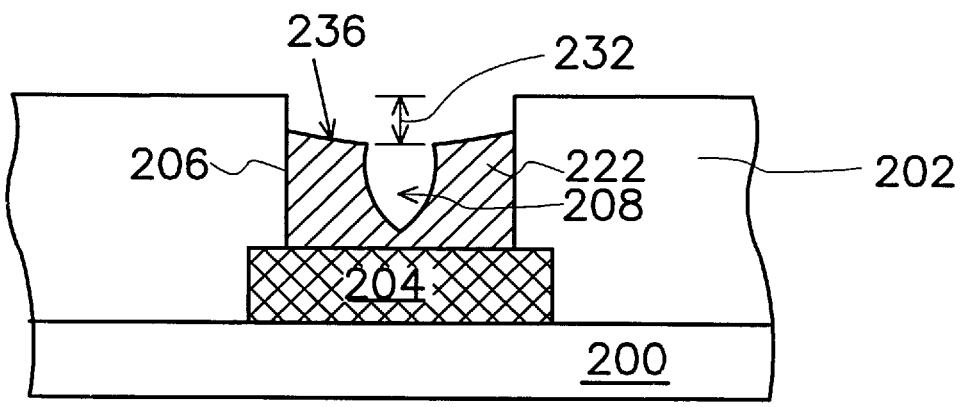

In FIG. 2C, an etch back step of the first plug material layer 222 is performed. A portion of the first plug material layer 222 on the surface of the dielectric layer 202 is removed. An over-polishing method is performed to prevent the first plug material layer 222 from remaining on the dielectric layer 202. A first dished surface 236 is formed on the surface of the opening 206 to expose the hole 208. The dished surface 236 is at a depth 232 of about 1000 Å.

Figure 2D:
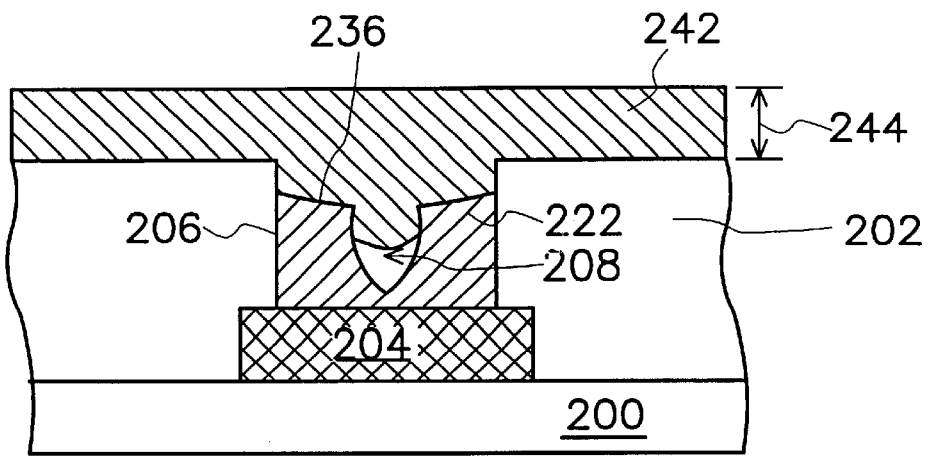

In FIG. 2D, a second coverage step is performed by using chemical vapor deposition, for example. A second plug material layer 242 is formed over the substrate 200. The thickness 244 of the second plug material layer 242 on the dielectric layer 202 is only about 2000 Å. The second plug material layer 242 is just sufficient to fill the first plug material layer 236 and cover the hole 208. The pollutant, such as slurry, thus does not have a chance to fill the hole 208.

Figure 2E:
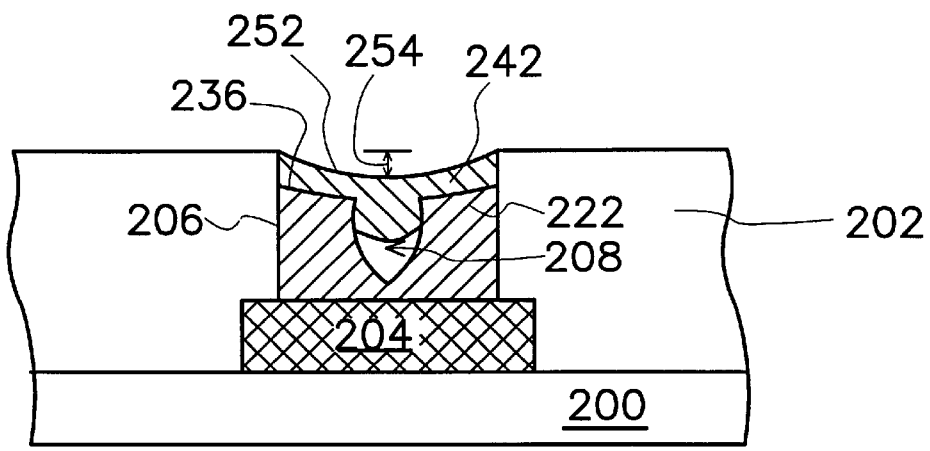

In FIG. 2E, a chemical mechanical polishing method is performed. A portion of the second plug material layer 242 on the surface of the dielectric layer 202 is removed. An over-polishing method is performed to prevent any portion of the second plug material layer 242 from remaining on the dielectric layer 202. A second dished surface 252 is formed in the surface of the opening 206. The depth 254 of the second plug material layer 236 is much shallower than the first plug material layer 236. The slurry cannot fill the hole 208 because the second plug material layer 242 covers the hole 208. Hence, the slurry cannot react with the plug material to reduce the reliability of the plug. Moreover, the thickness of the second plug material layer 242 that needs to be removed is only about 2000 Å, which is considerably less than the 5000 Å that must be removed by chemical mechanical polishing in the conventional, expensive process. The present invention reduces the thickness by about 60%. The cost of the fabricating process is decreased.

Figure 2F:
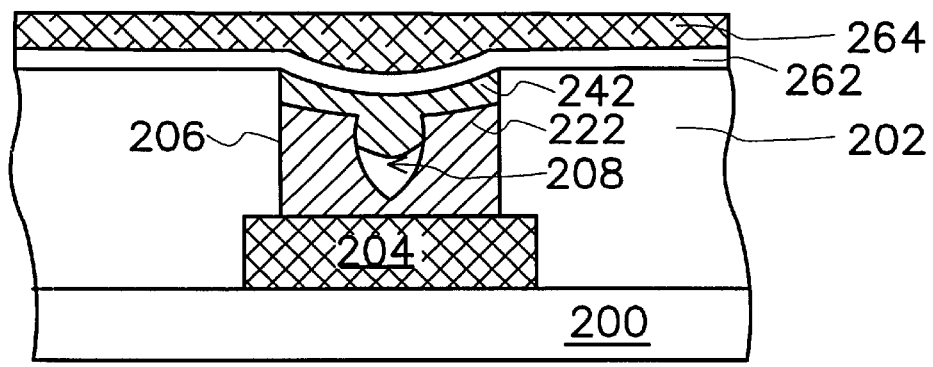

In FIG. 2F, a titanium/titanium nitride glue layer 262 is formed on the substrate 200. A top metallic layer 264 is formed on the substrate 200.

In summary, the characteristics of the invention include the following:

1. The hole is covered by the second plug material layer in the present invention. The slurry cannot fill the hole while chemical mechanical polishing is performed. The slurry cannot react with the plug material or the first metallic layer. The reliability of the plug according to the present invention is increased.

2. The present invention uses chemical mechanical polishing, which is an expensive process, to remove only about 2000 Å of the plug material thickness. The thickness is decreased by about 60% when compared to the conventional method, which has about a 5000 Å thickness. The cost is decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a plug, comprising the steps of:
   providing a substrate;
   forming a dielectric layer on the substrate, wherein the dielectric layer has an opening therein to expose a region, and the region is electrically coupled with other regions;
   performing a first coverage step to form a first plug material layer of a first plug material over the substrate, wherein the first plug material layer is sufficient to fill the opening;
   removing a portion of the first plug material from over the opening and completely removing the first plug material on the dielectric layer;
   performing a second coverage to form a second plug material layer on the substrate, wherein the second plug material layer sufficiently fills a dished surface formed by the first plug material in the opening such that a void formed after removing the portion of the first plug material in the opening is partially filled and covered by the second plug material layer; and
   performing a chemical mechanical polishing method to removed the second plug material layer on the dielectric layer.

2. The method of claim 1, wherein the material of the first plug material layer and the second plug material layer includes tungsten.

3. The method of claim 1, wherein the material of the first plug material layer and the second plug material layer includes aluminum.

4. The method of claim 2, wherein the method of the first coverage step and the second coverage step includes a chemical vapor deposition method.

5. The method of claim 1, wherein the thickness of the first plug material layer is about 5000 Å.

6. The method of claim 1, wherein the depth of the first dished surface is about 1000 Å.

7. The method of claim 1, wherein the depth of the second plug material layer is about 2000 Å.

8. A method of fabricating a plug, comprising the steps of:
   providing a substrate;
   forming a dielectric layer on the substrate, wherein the dielectric layer has an opening therein to expose a region, and the region is electrically coupled with other regions;
   performing a first coverage step to form a first plug material layer of a first plug material on the substrate, wherein a thickness of the first plug material layer is about 5000 Å;
   removing a portion of the first plug material layer from over the opening and completely removing the first plug material on the dielectric layer, wherein the first plug material in the opening has a dished surface and a depth of the dished surface is about 1000 Å;
   performing a second coverage to form a second plug material layer on the substrate, wherein the second plug material layer sufficiently fills the dished surface such that a void formed after removing the portion of the first plug material in the opening is partially filled and covered by the second plug material, and the thickness of the second plug material layer on the dielectric layer is about 2000 Å; and performing a chemical mechanical polishing method to remove the second plug material layer from the dielectric layer.

9. The method of claim 8, further comprising forming a first metallic layer between the dielectric layer and the substrate.

10. The method of claim 9, wherein the region which is electrically coupled with the other regions is a portion of the first metallic layer.

11. The method of claim 8, wherein the material of the first plug material layer and the second plug material layer includes tungsten.

12. The method of claim 8, wherein the material of the first plug material layer and the second plug material layer includes aluminum.

13. The method of claim 11, wherein the method of the first coverage step and the second coverage step includes a chemical vapor deposition method.

14. The method of claim 10, wherein after the step of removing the second plug material layer further includes forming a glue layer and a second metallic layer.

15. The method of claim 14, wherein the material of the glue layer includes titanium/titanium nitride.

* * * * *